(12) United States Patent
Oliveira et al.

(10) Patent No.: US 8,382,463 B2
(45) Date of Patent: Feb. 26, 2013

(54) DEVICE FOR PRODUCING STRUCTURED OPTICAL MATERIALS

(75) Inventors: Peter W. Oliveira, Saarbruecken (DE); Peter Rogin, Saarbruecken (DE); Michael Gros, Blieskastel (DE); Martin Amlung, Saarbruecken (DE); Michael Veith, St. Ingbert (DE)

(73) Assignee: Leibniz-Institut fuer Neue Materialien Gemeinnuetzige Gesellschaft mit beschraenkter Haftung, Saarbruecken (DE)

(*) Notice: Subject to any disclaimer, the term of this patent is extended or adjusted under 35 U.S.C. 154(b) by 261 days.

(21) Appl. No.: 12/452,842

(22) PCT Filed: Jun. 9, 2008

(86) PCT No.: PCT/DE2008/000970
§ 371 (c)(1),
(2), (4) Date: Feb. 22, 2010

(87) PCT Pub. No.: WO2009/012738
PCT Pub. Date: Jan. 29, 2009

(65) Prior Publication Data
US 2010/0155974 A1    Jun. 24, 2010

(30) Foreign Application Priority Data
Jul. 26, 2007    (DE) .................. 10 2007 035 387

(51) Int. Cl.
*B29D 11/00* (2006.01)
(52) U.S. Cl. ......... 425/115; 264/1.38; 264/1.6; 264/1.7; 425/174.4; 425/363

(58) Field of Classification Search .................... 264/1.1, 264/1.6, 1.36, 1.38, 1.34, 1.7; 425/174.4, 425/115, 122, 810, 324.1, 363, 385, 403.1
See application file for complete search history.

(56) References Cited

U.S. PATENT DOCUMENTS

| 5,914,825 | A * | 6/1999 | Nishio et al. ............... 359/851 |
| 6,236,493 | B1 | 5/2001 | Schmidt et al. |
| 6,445,504 | B1 * | 9/2002 | Suga et al. ............... 359/599 |
| 2009/0035703 | A1 | 2/2009 | Mennig et al. |

FOREIGN PATENT DOCUMENTS

| DE | 689 16 188 | 10/1994 |
| EP | 0 168 924 | 1/1986 |
| EP | 0 323 880 | 7/1989 |
| EP | 0 369 669 | 5/1990 |
| EP | 0 726 142 | 8/1996 |

(Continued)

OTHER PUBLICATIONS

International Search Report.

*Primary Examiner* — Mathieu D. Vargot
(74) *Attorney, Agent, or Firm* — Collard & Roe, P.C.

(57) ABSTRACT

The invention relates to a method for producing structured optical materials. It also relates to a device for producing structured optical materials, and to use of the method.
In order to create a novel, continuous method for the production of structured optical materials, which is more economical than the known production method, it is proposed within the scope of the invention that optical material be applied to a carrier, a carrier or protective film be laminated onto the optical material, the resulting laminate be exposed to light and thereby structured, and subsequently a delamination of at least one of the films be performed.

10 Claims, 1 Drawing Sheet

FOREIGN PATENT DOCUMENTS

| | | |
|---|---|---|
| EP | 0 891 565 | 1/1999 |
| EP | 1 239 329 | 9/2002 |
| WO | WO 96/30810 | 10/1996 |
| WO | WO 2006/125635 | 11/2006 |

* cited by examiner

DEVICE FOR PRODUCING STRUCTURED OPTICAL MATERIALS

CROSS REFERENCE TO RELATED APPLICATIONS

This application is the National Stage of PCT/DE2008/000970 filed on Jun. 9, 2008, which claims priority under 35 U.S.C. §119 of German Application No. 10 2007 035 387.3 filed on Jul. 26, 2007. The international application under PCT article 21 (2) was not published in English.

The invention relates to a method for producing structured optical materials. It also relates to a device for producing structured optical materials, and to use of the method.

Lithographic masking films are described in EP 168 924 A2, EP 323 880 A1 and DE 689 16 188 T2. A major disadvantage of masking films is that they can only be used once and that manufacturing them is tedious and costly.

Prior-art methods of producing diffusers and light management films for controlling light (for TFTs, projectors, displays, etc.) involved, for example, the use of such masking films for UV structuring and a modified Mathis film-coating unit. First of all, a polyester film was coated with the mask suspension (graphite in aqueous solution) and subsequently dried. The mask material was then rolled up and removed, as the film-coating unit had to be adapted for the actual diffuser production. The production of diffusers again involved coating a polyester film, this time with UV-structurable Photonanomer®, and then drying the film. The mask material and the Photonanomer® were subsequently combined to form a laminate prior to structuring with UV light. Following exposure, the mask and the diffuser were separated from each other again (delamination).

The WO 2006/125635 A1 describes a method of making regeneratable plates having a surface that is capable of being structured and comprises hydrophilic and hydrophobic areas excellently suited for the production of microstructures by means of exposure. These plates are variable and reversible, but cannot be integrated into a continuous process because they are flat. Accordingly, there are dwell times during exposure, and after the plates have been used once they have to be regenerated.

The production of optical components with a graded-index structure is known from EP 0 891 565 B1.

The object of the invention is to provide a new, continuous method and a new device for producing structured optical materials, which is more economical than the known production method.

This object is established by the invention with a method according to the preamble, said method being characterised in that optical material is applied to a carrier, a carrier or protective film is laminated onto the optical material, the resulting laminate is exposed to light and thereby structured, and subsequently a delamination of at least one of the films is performed.

This procedure is much simpler and therefore more economical than known methods.

In a preferred embodiment of the invention, provision is made for application of a mask material onto a transparent rotatable mask cylinder that is pressed against at least two bearing rollers, for structuring of the optical material in the section between the bearing rollers, and for subsequent delamination of the structured optical material from the mask cylinder.

As part of the invention, an innovative, continuous and economically feasible process for the production of structured optical materials was created, which makes masking-film production as per the prior art unnecessary and is accordingly a great deal more economical than the production process used hitherto. Centre-stage here is a mask cylinder that serves simultaneously as a mask and as transport means for the film.

It goes without saying that the mask material may also be applied to the mask cylinder by any other method of applying fluidic substances.

Subsequently, the laminate consisting of the mask cylinder and the mask material is subjected to exposure before it reaches the second bearing roller. Behind this bearing roller, no more pressure is exerted, and the structured optical material is separated again from the mask cylinder, i.e. delamination occurs.

This innovative continuous lithographic process and the associated production of light-management films could make the production of structured optical materials far more economical. Dispensing with masking-film production saves not only a considerable amount of time but also quite a few material and production costs (machinery, personnel, operating and material costs). At a guess, the time needed to produce structured optical materials will be halved thanks to the new process. This lithographic process will also simplify the production process as such, because this device does not require a separate control means. There is accordingly no need for control measures relating to application, exposure and delamination. The process used hitherto requires such measures, and these pose problems.

An embodiment of the invention consists in that radiation, in particular UV, IR, thermal or electron radiation, or light in the visible range, is coupled from one end of the mask cylinder into its hollow interior and is directed by a mirror located in the hollow interior of the mask cylinder onto the section between the bearing rollers.

Alternatively, the radiation source could be positioned, for example, in the hollow interior of the cylinder and directed onto the section between the bearing rollers.

An advantageous embodiment of the invention consists in that a symmetric mirror, an asymmetric mirror, a slewable mirror, a movable minor that can be preset or a semi-permeable minor is used to produce optical properties with localised variations.

With a minor of such kind, profiles showing localised variations may be produced in a continuous manufacturing process by redirecting the light beam. This is to advantage in the production of displays, for example. An asymmetric profile for the structuring may be obtained by tilting or slewing the minor.

In addition, a reflection or transmission hologram may be incorporated into a holographic material though use of a dual-wave technique: a laser beam or another suitable radiation source is first split up by a semi-permeable minor and then refocused onto the substrate by means of a suitable optical path system consisting of additional mirrors. The angle between the two beams determines the emerging holographic interference pattern according to Bragg's law. A mixture of two different types of hologram is relevant in the production of safety features, for example.

A refinement of the invention consists in that structuring is performed at preferably 30 to 70° C.

The scope of the invention also includes a device for producing structured optical materials, said device featuring means for applying a mask material onto a carrier, means for structuring the optical material and means for delaminating the mask material from the carrier, wherein a transparent rotatable mask cylinder is provided as carrier, means are provided for pressing the mask cylinder against at least two bearing rollers, and means are provided for coupling radiation into the section between the bearing rollers.

It is to advantage in this connection that a mask material is applied to the mask cylinder by means of dip-coating, spray-coating or vapour coating.

This mask material may, by way of example, be a hologram.

In this connection it has proved advantageous that the mask cylinder consists of glass, preferably of quartz glass.

The invention furthermore provides for the mask cylinder to be coated with modified NaSi.

To enable structuring by means of radiation, graphite or pigments may be used in the production of the structuring mask for the mask cylinder. Theoretically it is also possible to apply the mask material to the inside of the mask cylinder.

The scope of the invention also includes the provision of counterpressure rollers located in the interior of the mask cylinder, which press the mask cylinder against the bearing rollers.

A refinement of the invention consists in that the counter-pressure rollers are spring-mounted.

It is to advantage that the bearing rollers are provided with a rubber coating.

It is furthermore within the scope of the invention that radiation can be coupled from one end of the mask cylinder into the interior thereof and that a mirror for directing the radiation onto the section between the bearing rollers is provided in the hollow interior of the mask cylinder.

As already explained above, it is to advantage that the mirror is a symmetric mirror, an asymmetric mirror, a slewable mirror, a movable mirror that can be preset or a semi-permeable mirror.

This makes it possible to produce not only a symmetric optical profile (by perpendicular incident radiation) but also asymmetric optical profiles, in which case the radiation impinges on the material to be structured at an angle that deviates from the perpendicular.

Ultimately, it is expedient that a heat source for warming the optical material is located in the area between the two bearing rollers.

The subject matter of the invention furthermore includes use of the method according to the invention (and of the device according to the invention) for manufacturing diffusers, in particular asymmetric diffusers.

An embodiment of the invention is explained below in more detail by reference to drawings.

EXPERIMENTAL 1.1. Preparation 1.1.1 Coating System

The name of the system to be structured is Photonanomer®.

1.1.2 Mask

Figure 1:
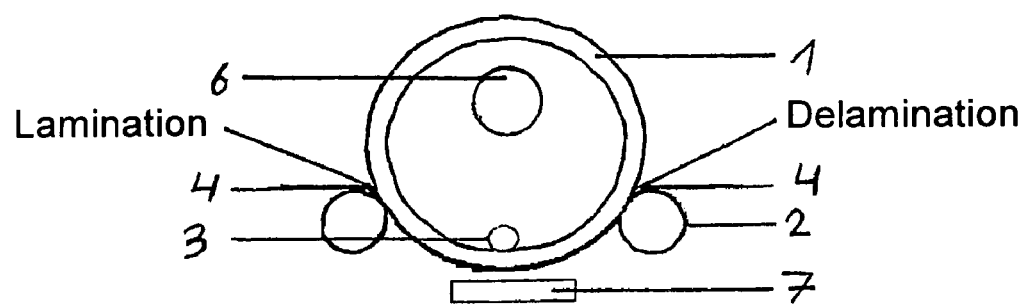
FIG. 1 shows a front view of a device according to the invention.
Figure 2:
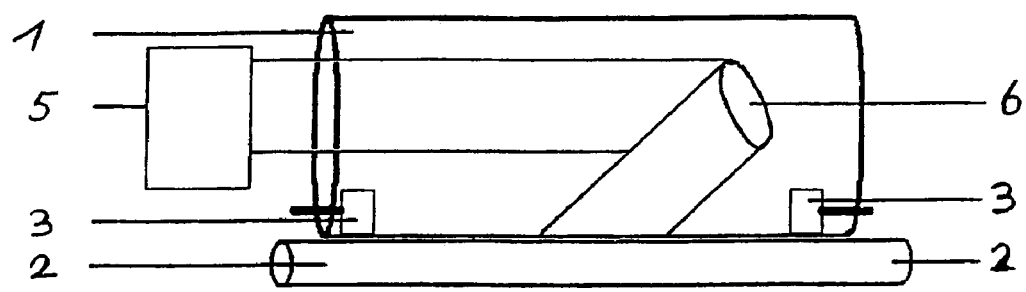
FIG. 2 shows a side view of a device according to the invention.

FIGS. 1 and 2 show the mask cylinder 1, which is a quartz glass cylinder (here with a wall thickness of 5 mm and a Ø of 300 mm). This quartz glass cylinder is dip-coated with NaSi that has been modified with graphite particles (NaSi+1.5 wt. % KS 4 graphite). The drawing speed during coating is 2 mm/s. On account of the volume displaced by the quartz glass cylinder, this corresponds to a speed of 4 mm/s. Drying is performed for 1 h at 80° C. in a drying cabinet. A subsequent high-temperature procedure at 500° C. (1 K/min, 1 h at 500° C.) serves to compact the mask.

As can be seen in FIGS. 1 and 2, the mask cylinder 1 is held by a support device. This device consists of a mounting base on which two supported bearing rollers 2, which are located outside the mask cylinder 1 and run parallel to the central axis thereof, and two counterpressure rollers 3 located inside the mask cylinder are mounted. The counterpressure rollers 3 inside the mask cylinder are spring-tensioned such that these counterpressure rollers 3 press the mask cylinder 1 against the bearing rollers 2 located on the outside of the mask cylinder 1. These four rollers ensure uniform rotation of the mask cylinder 1 and press it against the rubber-coated bearing rollers 2.

1.1.3 Substrate

As substrate material, use can be made, for example, of Melinex® 400, a polyester film with a thickness of 50 µm and a breadth of 540 mm. The outside of this film has received an anti-blocking pre-treatment. The coating is applied to the untreated inside of the substrate film.

1.1.4 Web Run

The web run can be divided roughly into three sections:
a) Coating
b) Drying
c) Exposure unit The Photonanomer® is applied by knife in section a). The layers are dried by forced-air circulation in section b), and UV structuring is ultimately performed in section c).

A more detailed description of the individual sections is contained under point 1.2.

1.2. Procedure 1.2.1 Coating 1.2.1.1 Unwinding and Master Roller

The following table contains the parameters for unwinding and for the master roller, with which the web speed is controlled.

| No. | Name | Value |
| --- | --- | --- |
| 1 | Coated film side | Inside |
| 2 | Unwinder brake pressure | 1 bar |
| 3 | Corona power | Off |
| 4 | Ionising bar yes/no | Off |
| 5 | Pressure-roller pressure | Off |
| 6 | Web speed | 0.2 m/min |

Parameters 2 and 6 in the above table are important. Parameter No. 2 is the brake pressure responsible for adequate web tension. If this parameter is selected incorrectly, the squeegee unit will overflow Parameter No. 6 is the speed of the film web, which is controlled via the master roller. For this first trial run, an extremely low speed of 0.2 m/min was selected so as to enable close monitoring and studying of the entire process. However, higher web speeds can be achieved without difficulty.

1.2.1.2 Doctor Knife

The following table lists the doctor-knife parameters.

| No. | Name | Value |
| --- | --- | --- |
| 7 | Doctor knife used | New |
| 8 | Doctor knife clearance | 175 µm |
| 9 | Squeegee unit used (width) | 6.5 cm |

-continued

| No. | Name | Value |
|-----|------|-------|
| 10 | Squeegee unit clearance | 1 mm |
| 11 | Filling method | Manual |
| 12 | Amount of coating material used | 200 ml |

This table shows the coating parameters for the knife-application process. Generally speaking, all the parameters can be varied such as to produce the desired end result. For example, the doctor knife clearance (No. 8) may be varied to produce the desired layer thickness. The coating width (No. 9) and the amount of coating material (12) may also be varied. An automatic filling method is conceivable, too, but is unsuitable for these trial runs. A very narrow coating width was selected so as to initially permit close control of the process.

1.2.2 Drying 1.2.2.1 Oven After the coating step, the layer is dried. The solvent is removed by means of the drying step. The following table shows the drying parameters.

| No. | Name | Value |
|-----|------|-------|
| 13 | Damper 1 | 9 |
| 14 | Damper 2 | 8 |
| 15 | Damper 3 | 8 |
| 16 | Damper 4 | 7 |
| 17 | Oven temperature | 80° C. |
| 18 | Air-circulation speed | 6.3 m/s |

The dampers listed in this table (Nos. 13-16) regulate the flow of circulating air inside the oven. Two of the dampers regulate the air intake, the other two the air distribution. These parameters, as well as the drying temperature, vary according to the type of oven. An 80° C. drying system is ideal for the photonanomer system used. The temperature must be adjusted accordingly for other systems. The air-circulation speed has been included here for the sake of completeness only, but is not an essential process parameter.

1.2.3 Exposure Unit

The support device and the cylinder mask, together with the associated exposure unit, are of major importance to the whole process. These essential components will now be explained in detail.

1.2.3.1 Lamination and Delamination

FIGS. 1 and 2 show the assembly comprising the exposure unit with the mask cylinder 1. Lamination and delamination are also integrated in this unit.

Structuring of the coated film 4 takes place in the section between the two bearing rollers 2. The bearing rollers 2 additionally serve as guiding means during lamination. That means that thanks to its inherent weight and to the counterpressure rollers, the mask cylinder 1 rests in form-locking manner on the two rubber-coated bearing rollers 2. When the coated film 4 (coating facing inwards towards the mask cylinder) passes between the first bearing roller 2 and the mask cylinder 1, the pressure exerted by these two components against each other laminates the coated film 4 onto the surface of the mask cylinder, i.e. onto the mask. The rubber-coated bearing rollers additionally ensure the exclusion of air bubbles in the laminate, which is essential in the production of optical components. Following the lamination step, the laminate comprising the mask cylinder and the coated film 4 is exposed to UV light before it reaches the second bearing roller 2. As the cylinder rotates past this bearing roller 2, the pressure exerted against the bearing roller 2 and hence against the film 4 is relaxed; as a result, the mask cylinder 1 and the film 4 are separated again, i.e. a delamination occurs.

On account of its own weight, of the counterpressure rollers 3 and of the film 4 laminated onto it, the mask cylinder 1 rotates at the same speed at which the film 4 moves. This obviates the need for additional control means for the mask cylinder and for the lamination and delamination steps. This part of the process is thus an autonomous unit requiring no separate regulation.

1.2.3.2 UV Structuring

FIGS. 1 and 2 also show the assembly comprising the exposure unit and the mask cylinder 1.

As already mentioned, structuring takes place between the two rubber-coated bearing rollers 2 of the mask system. The ultraviolet light is coupled from a UV light source 5 at one end of the mask cylinder 1 into its hollow interior. A mirror 6 (engineered to suit the wavelength of the UV light), which is likewise located in the interior of the mask cylinder 1, directs the UV light into the section of the mask cylinder 1 that is between the two bearing rollers 2. The mask and the coated film 4 are exposed; the structuring mechanism involved here is known. A heat source 7 is installed additionally underneath the film 4. This is intended to heat the film web to 30 to 70° C. during exposure, preferably to about 50° C., in order to make the desired structuring possible. In the case described here, this heat source is a conventional hot-air blower. The hot air is adjusted to the desired temperature by means of a temperature sensor.

The following table summarizes the process parameters for structuring.

| No. | Name | Value |
|-----|------|-------|
| 19 | Temperature | 50° C. |
| 20 | Wavelength | 365 nm |
| 21 | Intensity of illumination | 126 W/m$^2$ |
| 22 | Power setting for the lamp | 1000 W |

1. Results

This device can be used to produce structured coatings (diffusers). It combines three fundamental stages of the diffuser manufacturing process, namely lamination, exposure (structuring) and delamination. Furthermore, the process is simplified in that the device requires no independent control means.

The invention claimed is:

1. A device for producing structured optical materials, said device comprising:
   a transparent rotatable mask cylinder,
   an application device for applying an optical material comprising a coated film to the transparent rotatable mask cylinder, the application device comprising a first bearing roller,
   a structuring device for structuring the optical material,
   a delamination device for delaminating the optical material from the transparent rotatable mask cylinder, the delamination device comprising a second bearing roller, and
   pressing device for pressing the transparent rotatable mask cylinder against the first and second bearing rollers,
   wherein the structuring device comprises a radiation-coupling device for coupling radiation into a section between the first and second bearing rollers.

2. The device according to claim 1, wherein a mask material is applied to the transparent rotatable mask cylinder via dip-coating, spray-coating or vapour coating.

3. The device according to claim 1, wherein the transparent rotatable mask cylinder consists of glass.

4. The device according to claim 1, wherein the transparent rotatable mask cylinder is coated with NaSi modified with graphite particles.

5. The device according to claim 1, wherein the pressing device comprises counterpressure rollers for pressing the transparent rotatable mask cylinder against the first and second bearing rollers, the counterpressure rollers being disposed in an interior of the transparent rotatable mask cylinder.

6. The device according to claim 5, wherein the counterpressure rollers are spring-mounted.

7. The device according to claim 5, wherein the first and second bearing rollers are provided with a rubber coating.

8. The device according to claim 1, wherein radiation can be coupled from one end of the transparent rotatable mask cylinder into a hollow interior of the transparent rotatable mask cylinder, and wherein the radiation-coupling device comprises a mirror for directing the radiation onto the section between the first and second bearing rollers, the mirror being disposed in the hollow interior of the transparent rotatable mask cylinder.

9. The device according to claim 8, wherein the mirror is a symmetric mirror, an asymmetric mirror, a slewable mirror, a movable mirror that can be preset, or a semi-permeable mirror.

10. The device according to claim 1, further comprising a heat source for warming the optical material, the heat source being located in an area between the first and second bearing rollers.

* * * * *

UNITED STATES PATENT AND TRADEMARK OFFICE
CERTIFICATE OF CORRECTION

PATENT NO.       : 8,382,463 B2                                              Page 1 of 1
APPLICATION NO.  : 12/452842
DATED            : February 26, 2013
INVENTOR(S)      : Oliveira et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 288 days.

Signed and Sealed this
First Day of September, 2015

Michelle K. Lee
*Director of the United States Patent and Trademark Office*